United States Patent
Inanami et al.

(10) Patent No.: US 6,481,004 B2
(45) Date of Patent: Nov. 12, 2002

(54) CIRCUIT PATTERN DESIGN METHOD, EXPOSURE METHOD, CHARGED-PARTICLE BEAM EXPOSURE SYSTEM

(75) Inventors: Ryoichi Inanami, Kawasaki (JP); Shunko Magoshi, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/878,286

(22) Filed: Jun. 12, 2001

(65) Prior Publication Data

US 2002/0010906 A1 Jan. 24, 2002

(30) Foreign Application Priority Data

Jun. 13, 2000 (JP) .......................... 2000-177307

(51) Int. Cl.$^7$ ............................... G06F 17/50

(52) U.S. Cl. .................. 716/21; 716/19; 250/492.22
(58) Field of Search ................ 716/21, 19; 250/492.22

(56) References Cited

U.S. PATENT DOCUMENTS

| | | | | |
|---|---|---|---|---|
| 6,151,101 A | * | 11/2000 | Okino | 250/492.2 |
| 6,192,510 B1 | * | 2/2001 | Yamada | 378/35 |
| 6,238,824 B1 | * | 5/2001 | Futrell et al. | 430/5 |

FOREIGN PATENT DOCUMENTS

| | | |
|---|---|---|
| JP | 02885778 B2 | 4/1999 |
| JP | 11-274041 | 10/1999 |

OTHER PUBLICATIONS

Copy of U.S. Patent Application Serial No. 09/817,270, filed Mar. 27, 2001, to Inanami et al.

Ryoichi Inanami et al, "Throughput Enhancement Strategy of Maskless Electron Beam Direct Writing For Logic Device Direct Writing For Logic Device", IEEE 2000 Technical Digest, pp. 833–836, Dec. 10–13, 2000.

* cited by examiner

Primary Examiner—David Nelms
Assistant Examiner—Tu-Tu Ho
(74) Attorney, Agent, or Firm—Finnegan, Henderson, Farabow, Garrett & Dunner, L.L.P.

(57) ABSTRACT

A charged-particle beam exposure system includes a charged-particle beam exposure apparatus for forming a pattern on a sample by charged-particle beam exposure using both a character projection exposure method and a variable shaped beam exposure method, a standard cell library which stores information of a plurality of standard cells that optimize circuit patterns for function units, an aperture mask which is set in the charged-particle beam exposure apparatus, bears characters corresponding to the standard cells, and has an aperture block falling within the irradiation range of the charged-particle beam exposure apparatus, a CP aperture mask management table which stores an index unique to each aperture block that is formed on the aperture mask and bears the characters corresponding to the standard cells, information of the standard cells corresponding to the characters laid out on each aperture block, and the number of charged-particle beam shots necessary to expose all the characters corresponding to the standard cells by the character projection exposure method, and a design unit for designing a layout by looking up the standard cell library and the CP aperture mask management table.

8 Claims, 7 Drawing Sheets

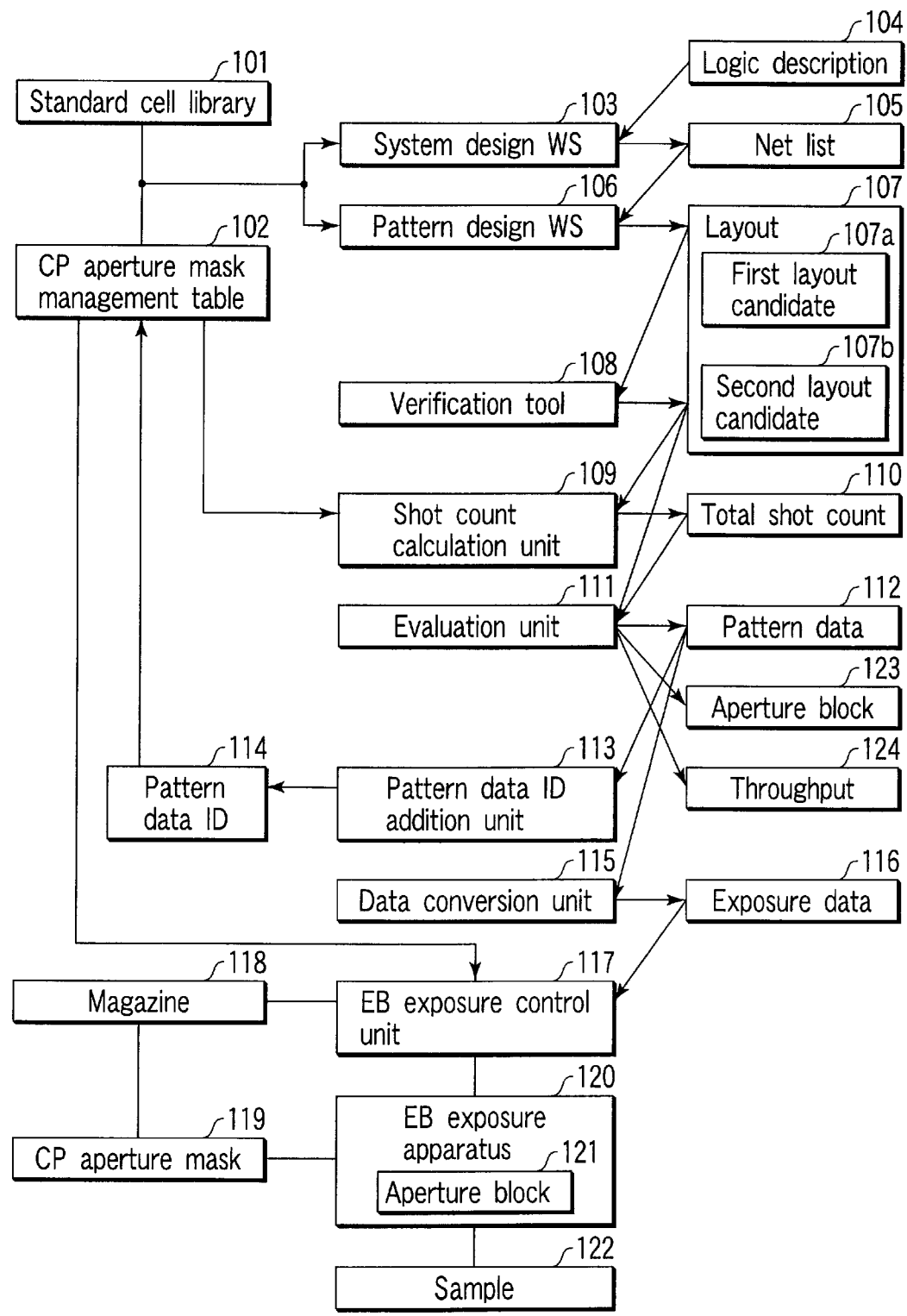
F I G. 1

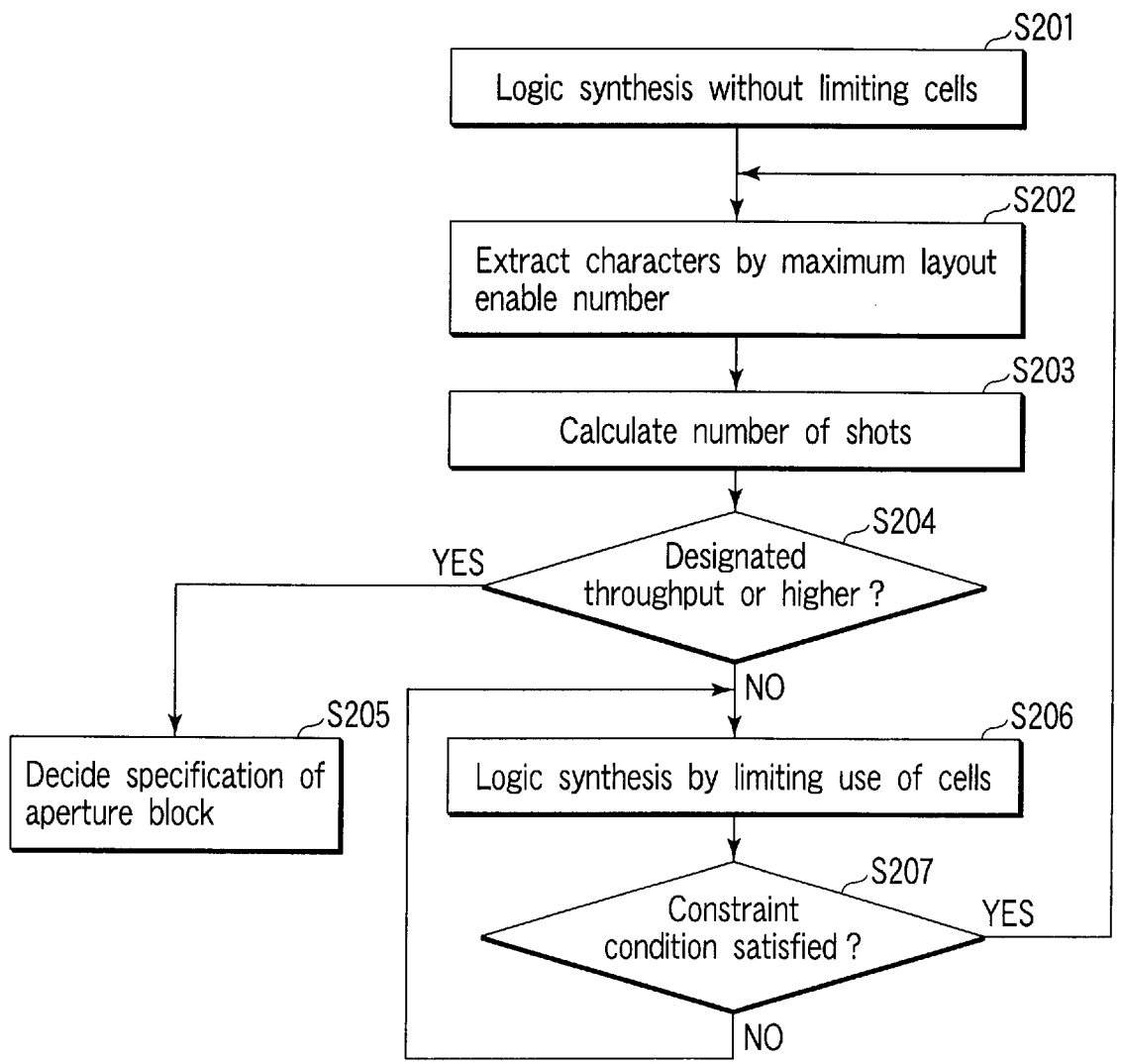
F I G. 4

CIRCUIT PATTERN DESIGN METHOD, EXPOSURE METHOD, CHARGED-PARTICLE BEAM EXPOSURE SYSTEM

CROSS-REFERENCE TO RELATED APPLICATIONS

This application is based upon and claims the benefit of priority from the prior Japanese Patent Application No. 2000-177307, filed Jun. 13, 2000, the entire contents of which are incorporated herein by reference.

BACKGROUND OF THE INVENTION

The present invention relates to a circuit pattern design method, exposure method, and charged-particle beam exposure system for a character projection type charged-particle exposure technique.

Electron beam exposure is an effective means for processing the micropattern of a semiconductor circuit. A VSB (Variable Shaped Beam) exposure method as a typical electron beam exposure method divides a circuit pattern into small rectangles or triangles and repetitively exposes them, which increases the number of electron beam shots and decreases the throughput. To prevent this, a CP (Character Projection) exposure method of shaping an electron beam into the shape of a figure with a size of several micro meter square and exposing a figure (character) at once is adopted to decrease the number of shots and increase the throughput. The electron beam is shaped via a CP aperture mask having character-shaped apertures.

The CP exposure method with electron beam extracts figures to be exposed by CP exposure method from a circuit pattern to be exposed, and performs exposure by using a CP aperture mask formed from a set of beam shaping characters corresponding to the figures.

FIG. 5 shows the schematic arrangement of an electron beam exposure apparatus. As shown in FIG. 5, an electron beam 602 emitted by an electron gun 601 is shaped into a beam with square cross section by a first shaping aperture 603. The shaped electron beam 602 irradiates via a character selection deflector 604 a character which is a transmission window formed in a CP aperture mask 605. The electron beam 602 having passed through the transmission window of the character is reduced by a reduction lens 606 and irradiates a desired position on a sample 608 via an objective deflector 607.

The arrangement of the CP aperture mask 605 shown in FIG. 5 will be described with reference to FIG. 6. As shown in FIG. 6, a plurality of aperture blocks 701 corresponding to respective deflection regions of the character selection deflector 604 are laid out on the CP aperture mask 605. A character-shaped transmission window 702 laid out within each aperture block 701 can be freely selected in exposure.

If the character shape formed in the aperture block is not a pattern frequently used in a semiconductor circuit pattern to be exposed, the effect of reducing the number of electron beam shots is poor. In other words, an aperture block formed from a character optimal for electron beam exposure must be prepared for each semiconductor circuit pattern (semiconductor device). One aperture block must be selected in exposure in correspondence with one semiconductor circuit pattern to be exposed.

A conventional pattern data design method is shown in the flow chart of FIG. 7. The designer designs circuit patterns (step S301). Repetitively used figures are extracted from the designed device patterns and set as characters to be exposed by CP exposure method (step S302).

A CP aperture mask having the extracted character shapes is prepared (step S303), and set in an electron beam exposure apparatus. The positions of CP apertures are selected to allow the character selection deflector to select an aperture block to be used (step S304). The circuit patterns are classified into characters to be exposed by CP exposure method and figures to be exposed by VSB exposure method, and they are converted into exposure data corresponding to the exposure apparatus (step S305).

The converted data are input to the exposure apparatus, and a sample such as a resist film on a silicon wafer or mask substrate is exposed with an electron beam by using a selected aperture block (step S306).

Conventionally, the operator who executes exposure selects and sets a corresponding aperture mask, or selects an aperture block to perform exposure. For example, Japanese Patent No. 2,885,778 discloses a method of setting an index to a circuit pattern or aperture mask and determining whether the index of the aperture mask set in the exposure apparatus is appropriate for a pattern to be exposed.

This method forms an aperture mask every time a circuit pattern is formed, which makes management of the circuit pattern and aperture mask difficult. If human errors in setting an aperture mask increase, or circuit patterns and CP apertures used for exposure increase, it becomes difficult to associate the circuit patterns with CP aperture and a desired pattern cannot be easily exposed.

BRIEF SUMMARY OF THE INVENTION (1) There is provided a circuit pattern design method for generating a circuit pattern from a logic description which describes circuit operation of a semiconductor device in a charged-particle beam exposure system having a charged-particle beam exposure apparatus for forming a pattern on a sample by charged-particle beam exposure using both a character projection exposure method and a variable shaped beam exposure method, a standard cell library which stores standard cells that optimize circuit patterns for function units, and a CP aperture mask management table which stores an index unique to each aperture block that is formed on an aperture mask used for exposure by the character projection exposure method and bears characters corresponding to the standard cells, information of the standard cells corresponding to the characters laid out on each aperture block, and the number of charged-particle beam shots necessary to expose all the characters corresponding to the standard cells by the character projection exposure method, comprising the step of generating a circuit pattern from the logic description for each aperture block by using standard cells corresponding to characters formed in one aperture block, and associating each circuit pattern with an aperture block used to generate the circuit pattern, the step of extracting a circuit pattern which satisfies a predetermined constraint condition from a plurality of generated circuit patterns, and the step of selecting a circuit pattern that requires a smallest number of charged-particle beam irradiation operations when charged-particle beam exposure is performed by using an aperture block corresponding to the extracted circuit pattern.

(2) According to the present invention, there is provided an exposure method comprising the steps of converting a circuit pattern designed by using the above-described circuit pattern design method into exposure data to be input to an exposure apparatus, selecting an aperture mask bearing an aperture block corresponding to the exposure data by looking up a CP aperture mask management table for the aperture block corresponding to the input exposure data, setting the aperture mask in a charged-particle beam exposure apparatus to move the aperture block used in a charged-particle beam irradiation enable range, and transferring a predetermined pattern onto a sample by using the aperture block.

(3) According to the present invention, there is provided a charged-particle beam exposure system comprising a charged-particle beam exposure apparatus for forming a pattern on a sample by charged-particle beam exposure using both a character projection exposure method and a variable shaped beam exposure method, a standard cell library which stores information of a plurality of standard cells that optimize circuit patterns for function units, an aperture mask which is set in the charged-particle beam exposure apparatus, bears characters corresponding to the standard cells, and has an aperture block falling within an irradiation range of the charged-particle beam exposure apparatus, a CP aperture mask management table which stores an index unique to each aperture block that is formed on the aperture mask and bears the characters corresponding to the standard cells, information of the standard cells corresponding to the characters laid out on each aperture block, and the number of charged-particle beam shots necessary to expose each character corresponding to the standard cell by the character projection exposure method, and a design unit for designing a layout by looking up the standard cell library and the CP aperture mask management table.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block diagram showing the schematic arrangement of an exposure system according to the first embodiment;

FIG. 4 is a flow chart showing a pattern data design method according to the third embodiment in the electron beam exposure system shown in FIG. 1;

DETAILED DESCRIPTION OF THE INVENTION

Figure 2:
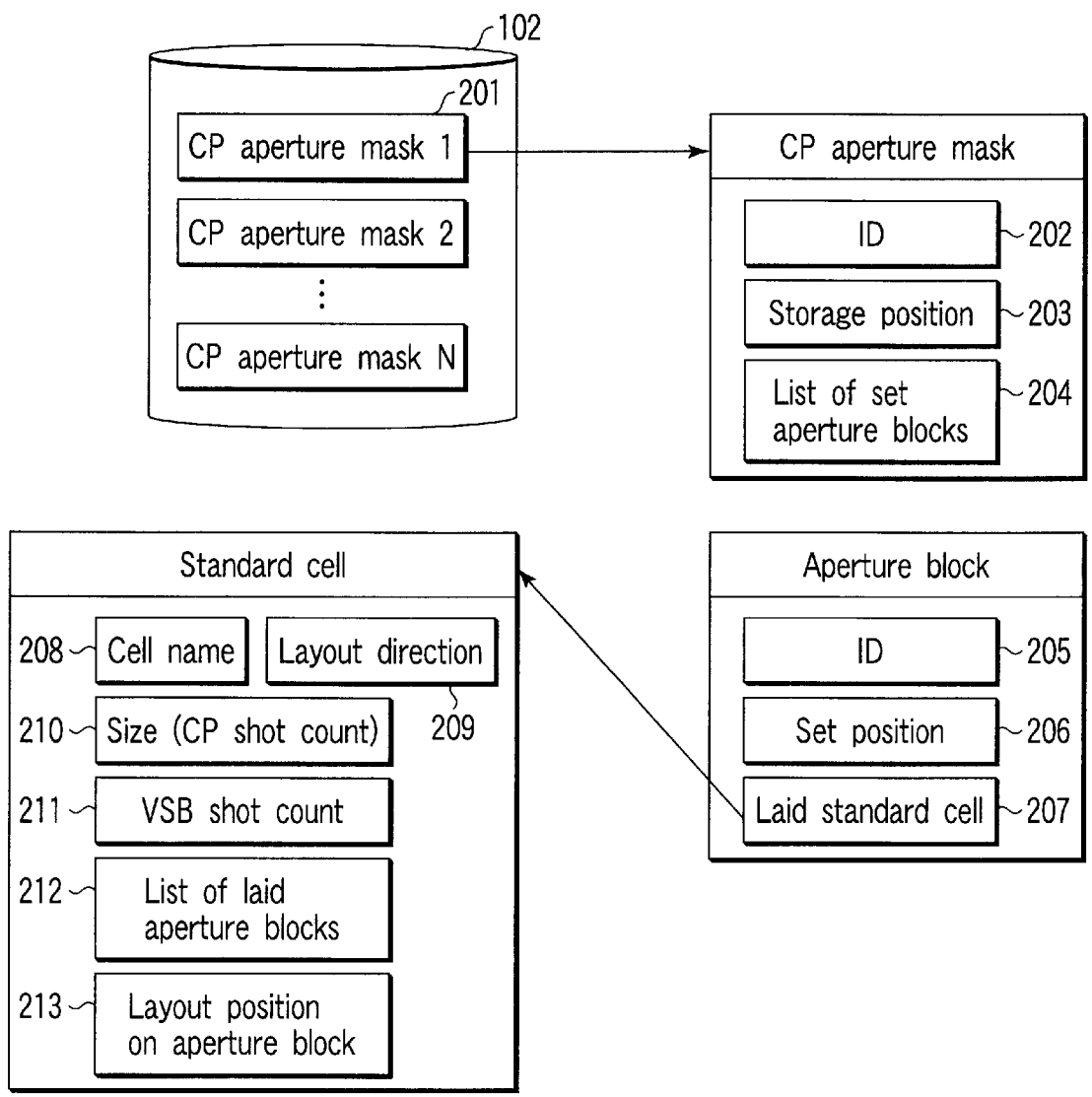
FIG. 2 is a view showing the structure of a CP aperture mask management table.

Embodiments of the present invention will be described below with reference to the several views of the accompanying drawing.

[First Embodiment]

In this system, a CP aperture mask management table is coupled to a standard cell library used to design a device pattern. In designing a pattern, characters on a selectable aperture mask are used to design a new device pattern. Logic synthesis and P&R (Place and Route) can be performed by using information about an aperture block and standard cell set on a CP aperture mask possessed in designing a pattern. A circuit pattern suitable for CP exposure method with electron beam can be generated.

FIG. 1 is a block diagram showing the schematic arrangement of a design and exposure system according to the first embodiment of the present invention. FIG. 1 is a block diagram when the circuit pattern of a given semiconductor device is generated, a CP aperture mask and aperture block optimal for the pattern are selected, and exposure beam electron is performed.

In FIG. 1, reference numeral 101 denotes a standard cell library in which standard cells that optimize circuit patterns for function units such as a logic gate and flip-flop are registered.

Reference numeral 102 denotes a CP aperture mask management table. The arrangement of the CP aperture mask management table 102 will be described with reference to FIG. 2.

As shown in FIG. 2, the CP aperture mask management table 102 manages a plurality of CP aperture masks 201. A unique aperture ID 202, a storage position 203 of a CP aperture mask in a CP aperture mask magazine, and a list 204 of aperture blocks set on the CP aperture mask are registered for each CP aperture mask 201. A unique ID 205, a set position 206 on a CP aperture mask, and a list of standard cells (characters) 207 laid out in an aperture block are recorded for each registered aperture block. A cell name 208 of a standard cell, a cell size (number of characters, i.e., number of shots in CP exposure method) 210, a layout position 213 within an aperture block, a layout direction (rotational angle and reverse) 209 of the cell, and a shot count 211 in VSB (Variable Shaped Beam) exposure method are recorded for each standard cell laid out on an aperture block.

In FIG. 1, reference numeral 103 denotes a system design WS(Work Station) which generates a net list 105 from a given logic description 104. The logic description 104 describes the operation of a semiconductor device by using a language called HDL (Hardware Description Language). For example, the logic description 104 is described by using RTL (Register Transfer Level).

Reference numeral 106 denotes a pattern design WS which generates a layout 107 from the net list 105 generates by the system design WS 103; 108, a verification tool which performs simulations or the like for the layout 107 and verifies whether the generates layout 107 satisfies design constrains; 109, a shot count calculation unit for calculating a total electron beam shot count 110 necessary to transfer the layout 107 onto a sample by looking up the CP aperture mask management table 102; 111, an evaluation unit for deciding pattern data 112 to be actually used for exposure; 113, a pattern data ID addition unit for adding a unique ID 114 to the pattern data 112 to be actually exposed, and registering the ID 114 in the CP aperture mask management table 102; and 115, a data conversion unit for converting the pattern data 112 into exposure data 116 corresponding to an EB (Electron Beam) exposure apparatus.

Reference numeral 117 denotes an EB (Electron Beam) exposure control unit for setting a CP aperture mask 119 used for exposure in an EB exposure apparatus 120 from a magazine 118 which stores aperture blocks in accordance with the converted exposure data 116, and for mechanically moving the CP aperture mask so as to enable exposing an aperture block 121 to be used.

Figure 3A:
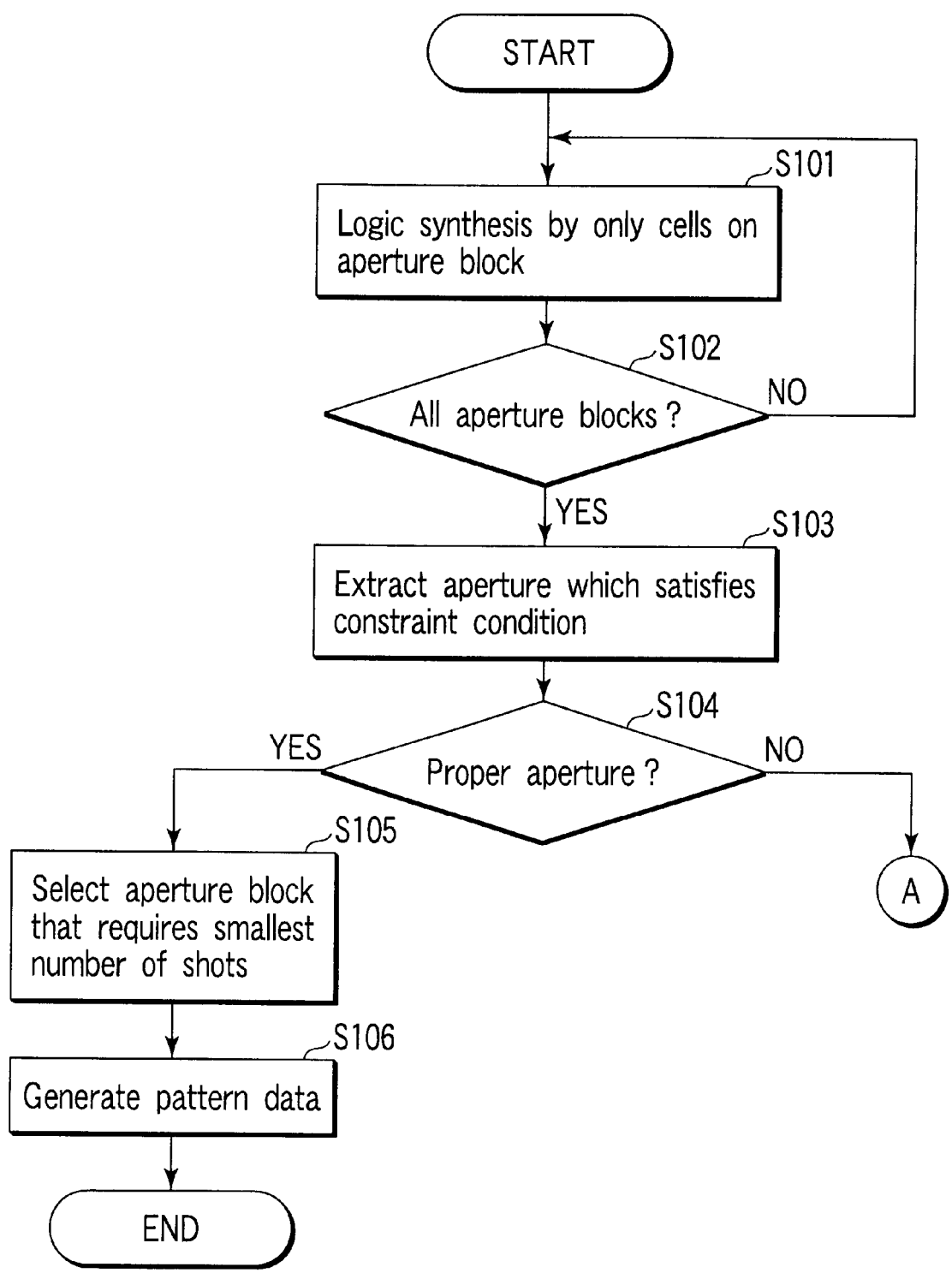
FIG. 3A is a flow chart showing a pattern data design method in the electron beam exposure system shown in FIG. 1.
Figure 3B:
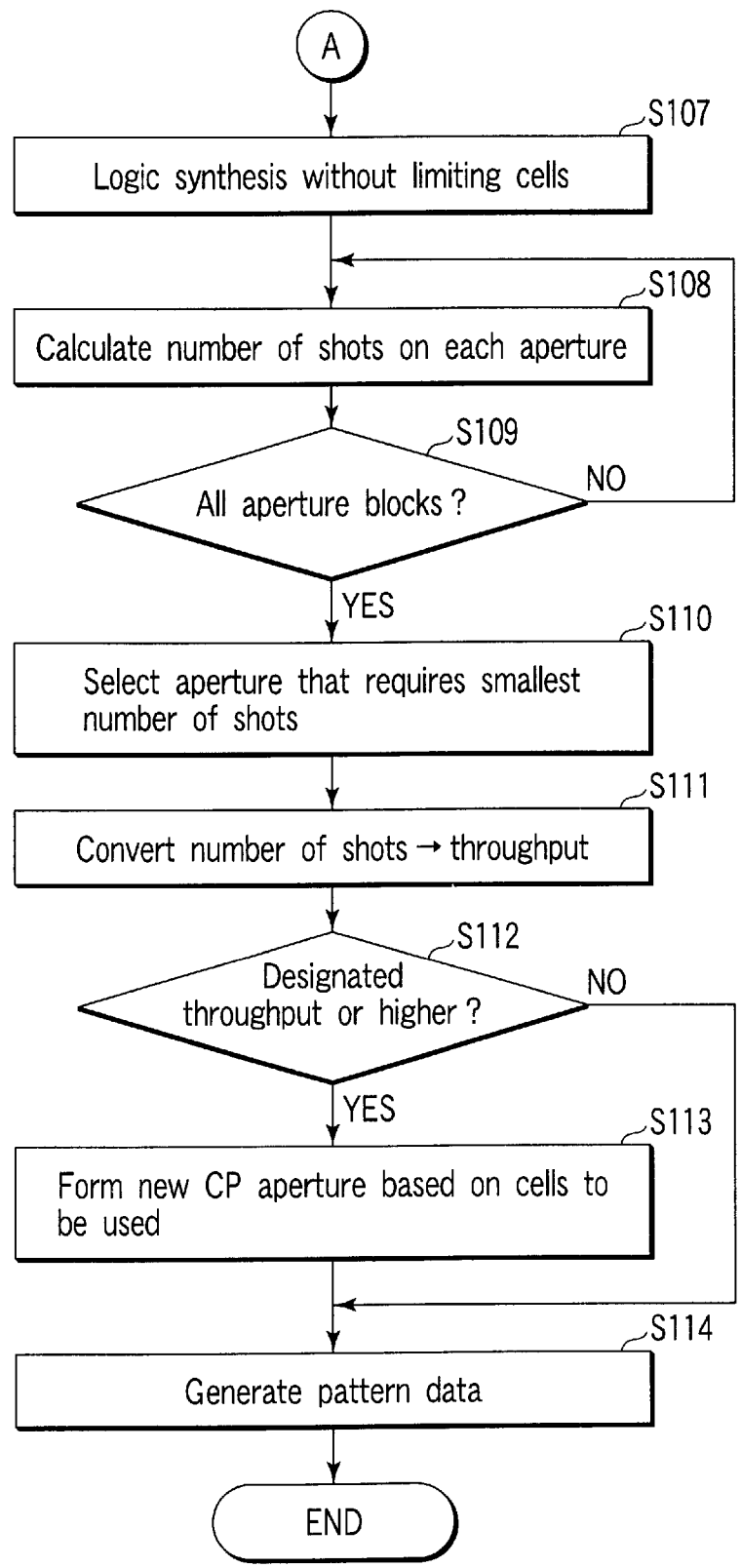
FIG. 3B is a flow chart showing the pattern data design method in the electron beam exposure system shown in FIG. 1.
Figure 5:
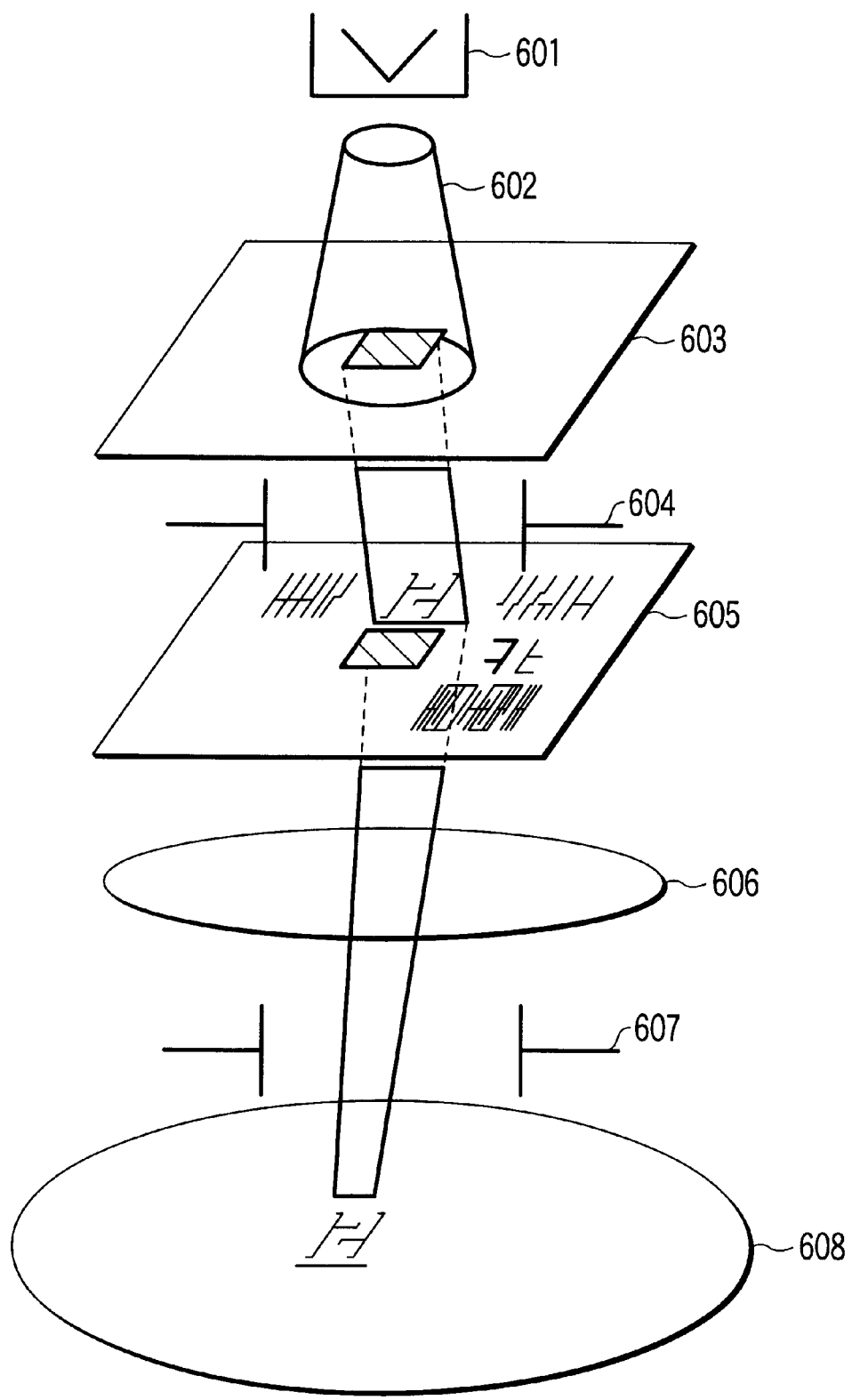
FIG. 5 is a view showing the schematic arrangement of an exposure apparatus.
Figure 6:
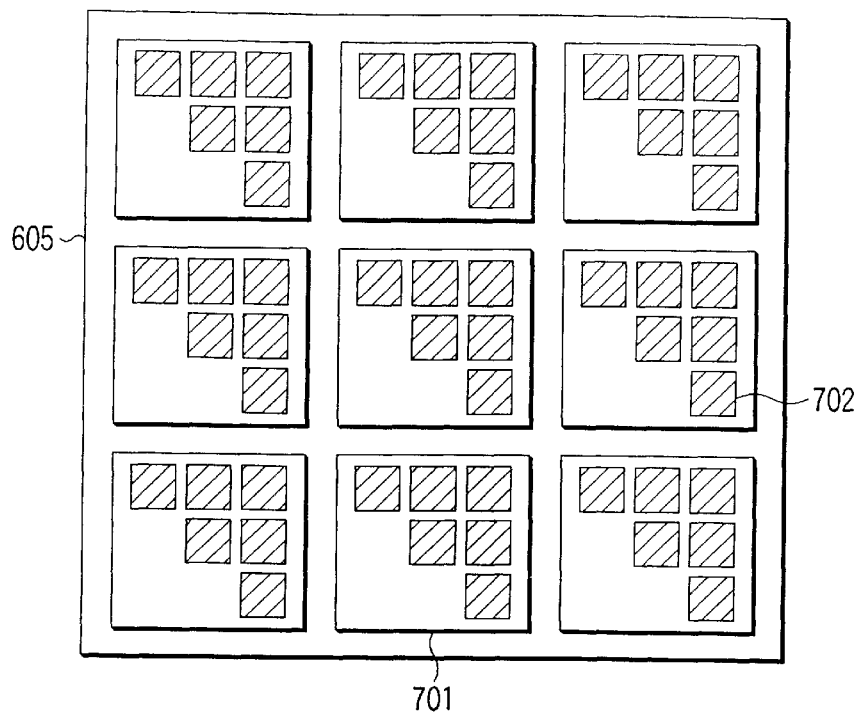
FIG. 6 is a view showing the layout of a CP aperture mask 605 shown in FIG. 5.

A series of steps from generation of the circuit pattern of a semiconductor device product to selection and exposure of a CP aperture mask and aperture block suitable for the pattern in the arrangement of the exposure system shown in FIG. 1 will be explained with reference to FIGS. 3A and 3B.

(Step S101)

The system design WS 103 designates a certain aperture block, and looks up the CP aperture mask management table 102 to obtain information about standard cells laid out on the designated aperture block. The system design WS 103 refers to the standard cell library 101 to obtain information about standard cells laid out on the designated aperture block.

The system design WS 103 performs logic synthesis by using only the standard cells laid out on the aperture block designated from the standard cell library 101 on the basis of the semiconductor device operation logic description 104 called HDL (Hardware Description Language), and generates a net list 105 which describes connection information among cells constituting a circuit.

The layout design WS 106 generates a layout (pattern data) 107 from the generated net list 105 by P&R (Place and Route; place cells in a chip of semiconductor device and connect between cells by referring the net list) by using the standard cell library 101 and CP aperture mask management table 102. The generated layout 107 is associated with the ID of the aperture block to be used.

Since the layout directions of the standard cells laid out on the provisional aperture block are registered, the directions of cells which can be laid out in a P&R step are limited to several ones.

(Step S102)

Whether the layout is generated by using the standard cells laid out on all the aperture blocks registered in the CP aperture mask management table 102 is determined. If the pattern data candidate is not generated by using all the aperture blocks, the flow returns to step S101, and the layout 107 is generated by using unused aperture blocks. If YES in step S102, the flow shifts to step S103.

A set of generated layouts will be called a first layout candidate 107a.

In some cases, only aperture blocks designated in advance may be used instead of using all the aperture blocks stored in the CP aperture mask management table 102.

(Step S103)

The verification tool 108 for performing timing verifications and simulations extracts, from the generated first layout candidate 107a, layouts 107 which satisfy design constraint conditions such as an operation frequency and chip area. A set of extracted layouts 107 will be called a second layout candidate 107b.

(Step S104)

Whether the second layout candidate 107b extracted in step S103 includes a layout which satisfies the design constraint conditions of the device pattern is examined. If YES in step S104, the flow advances to step S105; if NO, to step S107.

The first embodiment will exemplify a case wherein a layout which satisfies the constraint conditions exists, and the second embodiment will exemplify a case wherein a layout which satisfies the constraint conditions does not exist.

The case wherein a layout which satisfies the constraint conditions exists will be explained.

(Step S105)

If the second layout candidate includes a plurality of layouts as a result of examination in step S104, the shot count calculation unit 109 calculates the total number of electron beam shots for each layout of the second layout candidate 107b by looking up the CP aperture mask management table 102 and obtaining information about the number of electron beam shots necessary to form a pattern by CP exposure method.

Each layout is associated with the ID of an aperture block used in layout design. The ID of each aperture block, standard cells laid out on the aperture block, and the number of shots (cell size) necessary to transfer a layout onto each standard cell are registered in the CP aperture mask management table 102. By looking up the CP aperture mask management table 102, the total number of shots necessary to transfer a layout can be calculated.

The evaluation unit 111 compares the total electron beam shot counts 110 of respective layouts included in the second layout candidate 107b, and selects a layout with the smallest total number of electron beam shots. The selected pattern data is set as the pattern data 112 used for electron beam exposure.

If the second layout candidate 107b includes only one pattern data, this pattern data is set as the pattern data 112 used for electron beam exposure without calculating the number of shots.

(Step S106)

The pattern data ID addition unit assigns the pattern data ID 114 to the pattern data 112 selected in step S105, and registers the correspondence between the assigned pattern data ID 114 and the aperture block ID in the CP aperture mask management table 102.

(Exposure Step)

The data conversion unit 115 converts the (selected) pattern data 112 used for exposure into data in a format corresponding to the exposure apparatus, and inputs the converted exposure data 116 into the EB (electron beam) exposure control unit 117. After the exposure data 116 is input to the EB exposure control unit 117, information for an aperture block having an aperture block ID corresponding to the pattern data ID 114 is acquired from the CP aperture mask management table 102. The CP aperture mask 119 bearing the aperture block is set in the EB exposure apparatus 120 from the magazine 118 in accordance with the acquired data. The set CP aperture mask 119 is mechanically moved to enable exposing the aperture block 121 to be used. Then, electron beam exposure with character projection (CP) method is done to transfer the circuit pattern onto a sample 122.

Since pattern data suited to a possessed CP aperture mask can be generated for a designated semiconductor device, optimal CP aperture masks and aperture blocks can be decided for various patterns. The correspondences between the pattern data and the aperture blocks are managed by the CP aperture mask management table on the basis of their IDs.

Accordingly, pattern data, a CP aperture mask, and an aperture block which are used for exposure can be easily associated with each other. This prevents the operator who executes exposure from missing a correspondence or erroneously selecting an inappropriate aperture block.

All figures used within pattern data designed by this method are laid out on an aperture block and associated with characters for forming a pattern by CP exposure method. Hence, the number of electron beam shots minimizes, and the exposure throughput maximizes.

The electron beam exposure system adopted in the first embodiment can generate pattern data optimal for a possessed CP aperture and aperture block, and at the same time can decide an aperture block optimal for electron beam exposure of the pattern with CP method (i.e., the number of electron beam shots minimizes).

[Second Embodiment]

The second embodiment will exemplify a case wherein an aperture block which satisfies the design constraint conditions of a device pattern is not found in step S104 of the first embodiment.

(Step S107)

A system design WS 103 generates a net list by performing logic synthesis using all the standard cells stored in a standard cell library 101 without limiting standard cells used for logic synthesis. A pattern design WS 106 executes P&R by using the generated net list, and creates a layout. Meanwhile, a verification tool 108 verifies whether the layout satisfies design constraint conditions, and generates a layout 107 which satisfies them.

(Step S108)

A shot count calculation unit 109 extracts, from the layout obtained in step S107, cells which can be formed by standard cells within a given aperture block registered in a CP aperture mask management table 102. The shot count calculation unit 109 determines that the extracted cells are exposed with an electron beam by CP exposure method and the remaining cells are exposed by VSB exposure method, and calculates the total number of shots used to expose the entire device pattern with an electron beam. This calculation can be easily achieved because the numbers of shots used to expose standard cells by CP and VSB exposure method are registered in the CP aperture mask management table.

(Step S109)

Whether the total number of shots in a combination with VSB exposure method has been calculated for all the aperture blocks registered in the CP aperture mask management table is checked. If an aperture block not having undergone calculation of the total number of shots exists, the flow returns to step S108, and the shot count calculation unit 109 calculates the total number of shots for this aperture block. If the total number of shots has been calculated for all the aperture blocks registered in the CP aperture mask management table, the flow shifts to step S110.

(Step S110)

An aperture block which requires the smallest number of shots is selected from the aperture blocks having undergone calculation of the total number of shots in step S108.

(Step S111)

An evaluation unit 111 converts the number of electron beam shots with the aperture block selected in step S110 into a throughput 124 by using the parameters of an exposure apparatus and process conditions.

The parameters for calculating the throughput 124 include the beam irradiation time of one shot, the deflection standby times of various deflectors, the stage adjustment time, the beam adjustment time, the mark detection/alignment time, and the overhead. These parameters may be set in accordance with process conditions. Alternatively, standard conditions may be set, and comparison using a standard throughput calculated under the standard conditions may be done.

(Step S112)

The evaluation unit 111 determines whether the throughput 124 calculated in step S111 is equal to or higher than a set throughput. If NO in step S112, the flow advances to step S113; if YES, to step S114.

(Step S113)

If the designed pattern is determined not to be exposed at a speed equal to or higher than the desired throughput, a new CP aperture mask capable of exposure at a speed equal to or higher than the desired throughput is formed based on cells to be used. Formation of the new CP aperture mask will be described in the following embodiment.

(Step S114)

If YES in step S112, the evaluation unit 111 sets a combination of an aperture block 123 and pattern data 112 to be used for exposure. A pattern data ID addition unit 113 sets an ID to the designed pattern data 112, and registers the set ID in the CP aperture mask management table 102 in association with the ID of the aperture block selected in step S110.

(Exposure Step)

A data conversion unit 115 converts the pattern data 112 used (selected) for exposure into data in a format corresponding to the exposure apparatus, and inputs converted exposure data 116 to an EB (Electron Beam) exposure control unit 117. After the exposure data 116 is input to the EB exposure control unit 117, data of an aperture block having an aperture block ID corresponding to pattern data ID 114 is acquired from the CP aperture mask management table 102. A CP aperture mask 119 bearing the aperture block is set in an EB (Electron Beam) exposure apparatus 120 from a magazine 118 in accordance with the acquired data. The set CP aperture mask 119 is mechanically moved to enable exposing an aperture block 121 to be used. Then, electron beam exposure with CP method is done to transfer the circuit pattern onto a sample 122.

The exposure system described in the second embodiment can generate pattern data which can be exposed to a possessed CP aperture mask and aperture block at a desired throughput or more without newly preparing a CP aperture mask.

This can shorten the manufacturing period from design to exposure and can reduce the manufacturing cost of a CP aperture mask.

Generated pattern data and an aperture block to be used are associated in the CP aperture mask management table. Human errors such as a mistake of an aperture block to be set in exposure can be eliminated.

If an increase in cost by preparing a new CP aperture mask and the manufacturing period of the CP aperture mask are more important than the throughput, an aperture block selected in step S110 may be used for exposure without calculating the throughput for it. Also in this case, pattern data is registered in the CP aperture mask management table 102 in association with the ID of a selected aperture block.

Even when a pattern cannot be designed by only standard cells laid out on one aperture block, the second embodiment can generate pattern data which maximizes the throughput or realizes a desired or higher throughput, and can select an aperture block used to expose the pattern.

In this method, standard cells laid out on an aperture block are associated with characters for forming a pattern by CP exposure method, and the remaining standard cells are exposed by VSB exposure method. To calculate the number of electron beam shots in an exposure method using both CP and VSB exposure method, the number of shots by VSB exposure method must be registered in the CP aperture mask management table even for standard cells which are not laid out on the aperture block. To satisfy this, information shown in FIG. 2 must be registered for all the standard cells in the CP aperture mask management table. When a certain standard cell is formed as a through hole (beam formation hole) on a plurality of aperture blocks, the IDS of all the aperture blocks and the layout positions on the aperture blocks must be registered. No registration of a standard cell as a character for forming a pattern by CP exposure method on an aperture block means no information of a layout position on an aperture block of interest, which can be easily realized.

[Third Embodiment]

The third embodiment will describe a pattern data generation method, CP aperture mask preparation method, and electron beam exposure method using a new CP aperture mask in the exposure system of the third embodiment which newly includes the step of preparing a CP aperture mask.

Note that a new CP aperture mask is formed when no desired throughput is obtained even by using any possessed CP aperture mask and aperture block described above, or when no CP aperture mask is possessed and pattern data used for CP exposure method is to be generated (i.e., no CP aperture mask and aperture block are registered in the CP aperture mask management table).

In any case, a pattern is designed without limiting standard cells to be used. Pattern data which most satisfies the design constraint conditions of the device pattern can be selected from the generated pattern data. However, a pattern which is optimal for device characteristics may not be suited to electron beam exposure. Because standard cells which can be selected in logic synthesis are not limited, the number of types of cells to be used increases and exceeds the number of characters which can be laid out on an aperture block, and, the ratio of cells to be exposed by VSB exposure method increases, and therefore failing to obtain a desired throughput.

FIG. 4 is a flow chart showing generation of pattern data and preparation of a CP aperture mask that consider the above problem. A description is made with reference to FIG. 4.

(Step S201)

Logic synthesis and P&R are performed by using all standard cells without limiting standard cells to be used.

(Step S202)

The maximum number of characters which can be laid out in one aperture block is set as a condition, and characters for forming a pattern by CP exposure method are extracted. At this time, characters for forming a pattern by CP exposure method are extracted in descending order of electron beam shot count reduction effect with respect to the number of shots by CP in comparison with exposure by VSB exposure method as a character extraction reference. This shot count reduction effect is defined as "CP effectiveness" given by $$CP \text{ effectiveness} = \frac{\left[\begin{array}{c}(\text{Number of } VSB \text{ shots}) - \\ (\text{Number of } CP \text{ shots})\end{array}\right]}{(\text{Number of } CP \text{ shots})} \times (\text{Reference count})$$

In the equation, the number of VSB shots is the number of shots when standard cells are exposed by VSB exposure method. The number of CP shots is the number of shots when standard cells are exposed by CP exposure method, and is equal to the number of characters when cells are extracted as characters. The reference count is the use count of a standard cell.

If the electron optical system of an electron beam exposure apparatus cannot rotate or reverse an electron beam shaped by a CP aperture mask, cells in different layout directions must be assigned to different characters.

(Step S203)

A shot count calculation unit 109 calculates the total number of shots of an entire chip when the cells extracted in step S202 are exposed by CP exposure method and the remaining cells are exposed by VSB exposure method.

(Step S204)

An evaluation unit 111 described in the above embodiments is used to calculate a throughput for the total number of shots calculated in step S203. Whether the calculated throughput is equal to or higher than a numerical value designated in advance is checked.

(Step S205)

If YES in step S204, the pattern data synthesized in step S201 and the standard cells extracted in step S202 are adopted as pattern data used for exposure and characters used to newly prepare an aperture block.

IDs are set for the pattern data and corresponding aperture block in a CP aperture mask management table 102, and registered in it. A new aperture block is prepared in accordance with the information of the aperture block and standard cells registered in the CP aperture mask management table 102.

(Step S206)

If NO in step S204, the number of standard cells used in logic synthesis is decreased, and then logic synthesis and P&R are executed again. At this time, the number of standard cells usable in synthesis is decreased in an order of standard cells which are not extracted in step S202 and exhibit low CP effectiveness. Alternatively, the number of cells to be used may be gradually increased until constraint conditions are met, while cells exhibiting high CP effectiveness are left. In this case, cells are added to cells usable in synthesis in descending order of CP efficiency.

(Step S207)

Whether the pattern data synthesized again in step S206 satisfies design constraint conditions is checked. If YES in step S207, the flow returns to step S202 to calculate the number of shots when cells up to the maximum number of characters which can be laid out in an aperture block are exposed by CP exposure method and the remaining cells are exposed by VSB exposure method. The flow subsequent to step S202 is the same as that described above.

If NO in step S207, the flow returns to step S206 to further limit cells used in synthesis, and the same steps are repeated. If the number of cells is gradually increased, as described in step S206, the number of usable cells is increased in step S207.

The method of the third embodiment enables automatic preparation of a new CP aperture mask and automatic registration in the CP aperture mask management table. In preparing a new CP aperture mask, corresponding pattern data can also be optimized to maximize the throughput.

Even in preparing a new CP aperture mask, the system of the third embodiment automatically sets and registers an ID in the CP aperture mask management table together with pattern data used for exposure, similar to the above embodiments. This facilitates management of a CP aperture mask and aperture block. After a prepared aperture mask is set in a CP aperture mask magazine or the like, management is done in accordance with IDs set for the CP aperture mask and aperture block. The relationship of an aperture block corresponding to exposure data need not be considered, and errors such as a mistake of an aperture block to be selected can be minimized to achieve proper electron beam exposure.

Figure 7:
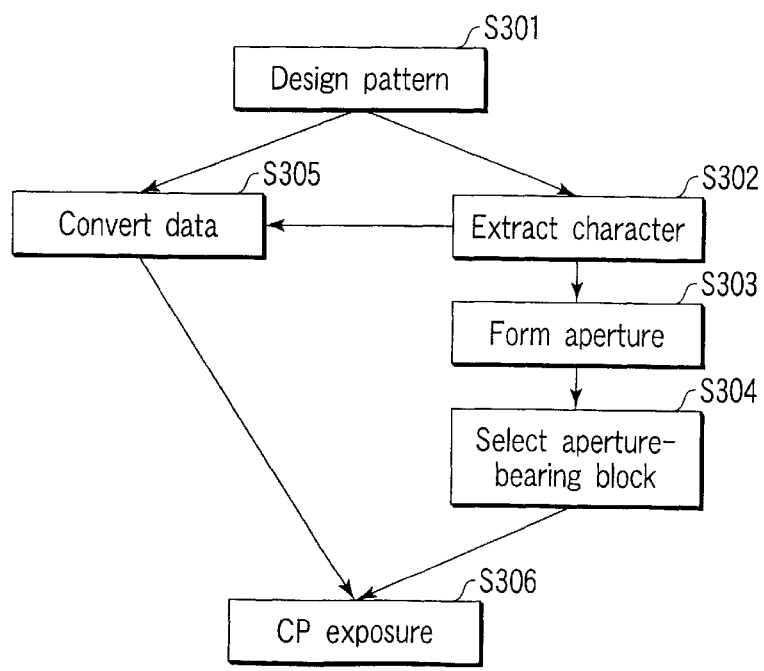
FIG. 7 is a flow chart showing a conventional pattern data design method and character projection exposure procedure.

A short manufacturing period and low aperture mask manufacturing cost cannot be attained when a CP aperture mask and aperture block are newly prepared by this method. However, the manufacturing period is shorter than in a conventional system because the CP aperture mask management table designates preparation of a new CP aperture mask and aperture block, unlike a conventional character extraction/CP aperture mask preparation system shown in FIG. 7. The prepared CP aperture mask and aperture block can be used for a device pattern designed later, which reduces the cost as a whole.

The present invention is not limited to the above embodiments. For example, the present invention can be applied to an exposure system using a charged-particle beam such as an ion beam in place of an electron beam.

The present invention can be variously modified without departing from the spirit and scope of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A circuit pattern design method for generating a circuit pattern from a logic description which describes circuit operation of a semiconductor device in a charged-particle beam exposure system having a charged-particle beam exposure apparatus for forming a pattern on a sample by charged-particle beam exposure using both a character projection exposure method and a variable shaped beam exposure method, a standard cell library which stores standard cells that optimize circuit patterns for function units, and a CP aperture mask management table which stores an index unique to each aperture block that is formed on an aperture mask used for exposure by the character projection exposure method and bears characters corresponding to the standard cells, information of the standard cells corresponding to the characters laid out on each aperture block, and the number of charged-particle beam shots necessary to expose all the characters corresponding to the standard cells by the character projection exposure method, comprising:

the step of generating a circuit pattern from the logic description for each aperture block by using standard cells corresponding to characters formed in each aperture block, and associating each circuit pattern with an aperture block used to generate the circuit pattern;

the step of extracting a circuit pattern which satisfies a predetermined constraint condition from a plurality of generated circuit patterns; and the step of selecting a circuit pattern that requires the smallest number of charged-particle beam irradiation operations when charged-particle beam exposure is performed by using an aperture block corresponding to the extracted circuit pattern.

2. The circuit pattern design method according to claim 1, wherein after the step of selecting a circuit pattern used to form the circuit pattern, the selected circuit pattern is registered in the CP aperture mask management table in association with an index of an aperture block associated with the selected circuit pattern.

3. The circuit pattern design method according to claim 1, wherein the number of charged-particle beam shots necessary to form a pattern corresponding to a character by the variable shaped beam exposure method is further registered in the CP aperture mask management table, and the method further comprises, when a circuit pattern which satisfies the constraint condition does not exist in the step of extracting a circuit pattern which satisfies the predetermined constraint condition:

the step of generating a circuit pattern which satisfies the constraint condition by using all standard cells included in the standard cell library;

the step of extracting, from generated circuit patterns for each aperture block registered in the CP aperture mask management table, a pattern which can be formed by the character projection exposure method using an aperture block, and calculating the total number of charged-particle beam shots as a sum of the number of charged-particle beam shots necessary to expose the extracted pattern by character projection method and the number of charged-particle beam shots necessary to expose an unextracted pattern by the variable shaped beam exposure method; and the step of selecting an aperture block that requires the smallest total number of charged-particle beam shots.

4. The circuit pattern design method according to claim 3, further comprising, after the step of selecting an aperture block requiring the smallest total number of charged-particle beam shots;

calculating a throughput under a designated exposure condition in transferring a pattern corresponding to the circuit pattern by using the selected aperture block; and if the calculated throughput is not less than a designated throughput, registering the circuit pattern in the CP aperture mask management table in association with an index of the selected aperture block.

5. The circuit pattern design method according to claim 4, further comprising, when a calculation result of the throughput is lower than the designated throughput:

issuing an instruction of preparing a new aperture block by using cells included in a generated circuit pattern as characters to be exposed by the character projection exposure method in descending order of shot count reduction effect within the number of characters which can be laid out in an aperture block; and registering, in the CP aperture mask management table, a generated aperture block, an aperture mask bearing the aperture block, a position of the aperture block on the aperture mask, and a generated circuit pattern in association with each other.

6. An exposure method comprising:

converting a circuit pattern designed by using a circuit pattern design method defined in any one of claims 1 to 5 into exposure data to be input to an exposure apparatus;

selecting an aperture mask bearing an aperture block corresponding to the exposure data by looking up a CP aperture mask management table for the aperture block corresponding to the input exposure data;

setting the aperture mask in a charged-particle beam exposure apparatus to move the aperture block used in a charged-particle beam irradiation enable range; and transferring a predetermined pattern onto a sample by using the aperture block used.

7. A charged-particle beam exposure system comprising:

a charged-particle beam exposure apparatus for forming a pattern on a sample by charged-particle beam exposure using both a character projection exposure method and a variable shaped beam exposure method;

a standard cell library which stores information of a plurality of standard cells that optimize circuit patterns for function units;

an aperture mask which is set in said charged-particle beam exposure apparatus, bears characters corresponding to the standard cells, and has an aperture block falling within an irradiation range of said charged-particle beam exposure apparatus;

a CP aperture mask management table which stores an index unique to each aperture block that is formed on said aperture mask and bears the characters corresponding to the standard cells, information of the standard cells corresponding to the characters laid out on each aperture block, and the number of charged-particle beam shots necessary to expose all the characters corresponding to the standard cells by the character projection exposure method; and a design unit for designing a layout by looking up said standard cell library and said CP aperture mask management table.

8. The charged-particle beam exposure system according to claim 7, wherein said CP aperture mask management table further stores an index unique to each CP aperture mask set in said exposure apparatus, information about a position and layout direction of each character on the aperture block, an index unique to exposure data, and information of an index of an aperture block corresponding to the index unique to the exposure data.

* * * * *